(12) United States Patent
Nishimura

(10) Patent No.: US 12,414,316 B2
(45) Date of Patent: Sep. 9, 2025

(54) METHOD OF MANUFACTURING SILICON CARBIDE SEMICONDUCTOR DEVICE AND SILICON CARBIDE SEMICONDUCTOR DEVICE

(71) Applicant: FUJI ELECTRIC CO., LTD., Kawasaki (JP)

(72) Inventor: Takeyoshi Nishimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 469 days.

(21) Appl. No.: 17/950,674

(22) Filed: Sep. 22, 2022

(65) Prior Publication Data

US 2023/0163220 A1 May 25, 2023

(30) Foreign Application Priority Data

Nov. 25, 2021 (JP) .................................. 2021-191203

(51) Int. Cl.
| | | |
|---|---|---|
| *H10D 8/60* | (2025.01) | |
| *H01L 21/04* | (2006.01) | |
| *H10D 8/01* | (2025.01) | |
| *H10D 62/832* | (2025.01) | |
| *H10D 64/62* | (2025.01) | |

(52) U.S. Cl.
CPC ........... *H10D 8/60* (2025.01); *H01L 21/0485* (2013.01); *H10D 8/051* (2025.01); *H10D 62/8325* (2025.01); *H10D 64/62* (2025.01)

(58) Field of Classification Search
CPC ...... H01L 21/0485; H10D 8/051; H10D 8/60; H10D 62/8325; H10D 64/62
See application file for complete search history.

(56) References Cited

U.S. PATENT DOCUMENTS

| | | | |
|---|---|---|---|
| 6,599,644 B1 * | 7/2003 | Zekentes | H01L 21/0485 438/597 |
| 8,367,507 B1 | 2/2013 | Tsuchiya et al. | |
| 2010/0055858 A1 | 3/2010 | Hayashi et al. | |
| 2011/0233560 A1 * | 9/2011 | Koike | H01L 21/0485 257/77 |
| 2018/0158914 A1 | 6/2018 | Kitamura et al. | |

(Continued)

FOREIGN PATENT DOCUMENTS

| | | |
|---|---|---|
| JP | 3333896 B2 | 10/2002 |
| JP | 4291875 B2 | 7/2009 |
| JP | 2010-205824 A | 9/2010 |

(Continued)

*Primary Examiner* — Zandra V Smith
*Assistant Examiner* — Molly K Reida
(74) *Attorney, Agent, or Firm* — Rabin & Berdo, P.C.

(57) ABSTRACT

A method of manufacturing a silicon carbide semiconductor device includes selectively forming a semiconductor region of a conductivity type at a first main surface of a semiconductor substrate containing silicon carbide; forming a nickel layer above the semiconductor region; ion-implanting aluminum in the nickel layer; performing a heat treatment to the nickel layer implanted with the aluminum to thereby form an ohmic contact layer in ohmic contact with the semiconductor region; forming a first electrode that is in contact with the ohmic contact layer, the semiconductor region, and the semiconductor substrate; and forming a second electrode on a second main surface of the semiconductor substrate.

11 Claims, 10 Drawing Sheets

(56) References Cited

U.S. PATENT DOCUMENTS

2021/0175369 A1 6/2021 Ohse et al.
2021/0242021 A1 8/2021 Alfieri et al.

FOREIGN PATENT DOCUMENTS

| JP | 5482107 B2 | 4/2014 |
| JP | 5613640 B2 | 10/2014 |
| JP | 2018-098227 A | 6/2018 |
| JP | 2021-093522 A | 6/2021 |
| JP | 2021-125685 A | 8/2021 |

* cited by examiner

METHOD OF MANUFACTURING SILICON CARBIDE SEMICONDUCTOR DEVICE AND SILICON CARBIDE SEMICONDUCTOR DEVICE

CROSS REFERENCE TO RELATED APPLICATIONS

This application is based upon and claims the benefit of priority of the prior Japanese Patent Application No. 2021-191203, filed on Nov. 25, 2021, the entire contents of which are incorporated herein by reference.

BACKGROUND OF THE INVENTION

1. Field of the Invention

Embodiments of the invention relate to a method of manufacturing a silicon carbide semiconductor device and a silicon carbide semiconductor device.

2. Description of the Related Art

Silicon carbide (SiC) semiconductors have gained attention in recent years as a semiconductor material that enables fabrication (manufacturing) of a semiconductor device (hereinafter, silicon carbide semiconductor device) that exceeds the limits of a semiconductor device in which a silicon (Si) semiconductor is used. In particular, silicon carbide semiconductors have high breakdown field strength and high thermal conductivity as compared to silicon semiconductors and by taking advantage of these features, application to high-voltage (for example, 1700V or greater) semiconductor devices is expected.

In an instance in which a silicon carbide semiconductor device is a diode (hereinafter, silicon carbide diode), design specifications of an n-type epitaxial layer that configures an n'-type drift region may be set for a thin thickness and a high impurity concentration and therefore, silicon carbide diodes up to a breakdown voltage of about 3300V typically have a Schottky barrier diode (SBD) structure. An SBD structure is formed by a semiconductor substrate and a front electrode configured by a metal layer provided on a front surface of the semiconductor substrate.

Normally, in an SBD structure, electric field strength is high at a contact surface of the semiconductor substrate in contact with a contact surface of the front electrode and a problem of increased reverse leakage current due to electrons tunneling the Schottky barrier when reverse voltage is applied or a problem of increased reverse leakage current due to surface defects unique to silicon carbide arises. Therefore, a silicon carbide diode has been proposed in which a junction barrier Schottky (JBS) structure having a mixture of Schottky junctions and pn junctions on a front side of an n-type semiconductor substrate is adopted.

A structure of a conventional silicon carbide diode having a JBS structure is described. FIG. 24 is a plan view depicting a layout when a conventional silicon carbide semiconductor device is viewed from a front side of a semiconductor substrate thereof. FIG. 25 is a cross-sectional view depicting the structure along cutting line A-A' in FIG. 24. In FIG. 24, a voltage withstanding structure of an edge termination region, a front electrode disposed on a front surface of the semiconductor substrate, a field oxide film, etc. are not depicted.

A conventional silicon carbide semiconductor device 140 depicted in FIGS. 24 and 25 has, in an active region 110, both a SBD structure (Schottky region 104) formed by a Schottky junction between the n-type semiconductor substrate 101 and a Schottky metal 106 that is a lowermost layer of a front electrode 114, and a JBS structure (pn diode region 103) formed by a pn junction between p-type well regions 102 and the n-type semiconductor substrate 101 in an n-type semiconductor substrate 101, at front side thereof. FIG. 26 is a circuit diagram of the SBD of the JBS structure. As depicted in FIG. 26, a Schottky diode 141 and a pn diode 142 are connected in parallel in the silicon carbide diode having the JBS structure.

Further, in the pn diode regions 103, for example, a nickel silicide layer 116 is formed to form ohmic contacts with the p-type well regions 102. In FIG. 24, the nickel silicide layer 116 having a striped pattern extending in a direction parallel to a front surface of the n-type semiconductor substrate 101 is indicated with hatching.

The p-type well regions 102 are provided in surface regions of the n-type semiconductor substrate 101 at the front surface thereof in the active region 110. The front surface of the n-type semiconductor substrate 101 is exposed between the p-type well regions 102 adjacent to one another. Pn junctions are formed by the p-type well regions 102 and the n-type semiconductor substrate 101. Portions of the n-type semiconductor substrate 101 between the p-type well regions 102 adjacent to one another form Schottky junctions with the Schottky metal 106 provided on the front surface of the n-type semiconductor substrate 101.

In this manner, the JBS structure has a mixture of the Schottky junctions formed at the contact surfaces between the n-type semiconductor substrate 101 and the front electrode 114, and the pn junctions; and thus, the electric field strength at the contact surfaces between the n-type semiconductor substrate 101 and the front electrode 114 may be reduced, whereby it becomes possible to suppress the reverse leakage current to that typical for a freewheeling diode (FWD) that uses a silicon semiconductor.

The front electrode 114 is configured by an anode electrode 107 and the Schottky metal 106 while a cathode electrode 108 constituting a back electrode is provided on a back surface of the n-type semiconductor substrate 101. Further, in an edge termination region 130, a voltage withstanding structure 115 is provided.

In a method of manufacturing the conventional silicon carbide diode having the JBS structure, the ohmic contacts between the p-type well regions 102 and the nickel silicide layer 116 are formed as follows. First, on the p-type well regions 102 and the n-type semiconductor substrate 101, a nickel layer is deposited followed by an aluminum layer and thereafter, an aluminum-nickel compound layer is formed by a low-temperature sintering (baking) treatment. Next, the nickel layer that remains on the surface of the aluminum-nickel compound layer is removed and thereafter, silicon atoms in the semiconductor substrate and nickel atoms in the aluminum-nickel compound layer are caused to react and form a silicide by a sintering treatment at a higher temperature, whereby the nickel silicide (NiSi) layer 116 constituting an ohmic electrode that is in ohmic contact with the p-type well regions 102 is formed.

As a method of forming an ohmic contact, a method has been proposed in which a stacked film containing a nickel layer and an aluminum layer is formed on a p-type impurity region and the stacked film is heat treated to thereby form on the p-type impurity region, a p-type ohmic electrode containing an alloy of nickel, aluminum, silicon, and carbon (for example, refer to Japanese Patent No. 4291875).

Further, as another method of forming an ohmic contact, a method has been proposed that includes providing a p-type silicon carbide layer having a first main surface and a second main surface that is opposite to the first main surface, and forming an implanted layer adjacent to the first main surface by implanting ions in the p-type silicon carbide layer from the first main surface, by plasma immersion ion-implantation (for example, refer to Japanese Laid-Open Patent Publication No. 2021-125685).

SUMMARY OF THE INVENTION

According to an embodiment of the invention, a method of manufacturing a silicon carbide semiconductor device includes: preparing a semiconductor substrate containing silicon carbide, the semiconductor substrate having a first main surface and a second main surface opposite to each other; selectively forming a semiconductor region of a conductivity type in the semiconductor substrate, at the first main surface of the semiconductor substrate; forming a nickel layer above the semiconductor region; ion-implanting aluminum in the nickel layer; performing a heat treatment to the nickel layer implanted with the aluminum, to thereby form an ohmic contact layer that is in ohmic contact with the semiconductor region; forming a first electrode that is in contact with the ohmic contact layer, the semiconductor region, and the semiconductor substrate; and forming a second electrode on the second main surface of the semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
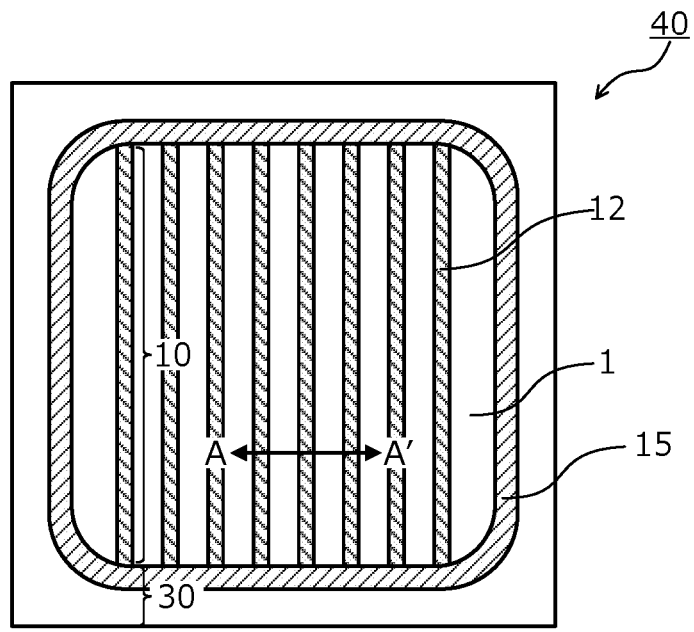
FIG. 1 is a plan view depicting a layout when a silicon carbide semiconductor device according to an embodiment is viewed from a front side of a semiconductor substrate thereof.

First, problems associated with the conventional techniques are discussed. In an instance in which the nickel silicide layer 116 (ohmic electrode) that is in contact with only the p-type well regions 102 between the n-type semiconductor substrate 101 and the Schottky metal 106 is provided to enhance the surge current capability of the conventional silicon carbide semiconductor device 140 (silicon carbide diode having a JBS structure) described above, excess carbon (C) is generated due to the formation of the silicide layer. A certain amount of the excess carbon may precipitate in clusters, whereby problems such as interlayer peeling and damage occur. Further, the excess carbon also impedes formation of the nickel silicide layer 116 that is for reducing contact resistance.

Thus, methods have been proposed that add a process for removing the excess carbon, such as forming a metal layer on the surface of the nickel layer to react with the carbon and suppress precipitation of carbon at the surface of the metal layer, or the like. Nonetheless, metal variation and stress are unevenly distributed due to the difference in melting temperatures of nickel and the carbon reaction metal, whereby control of the formation of the nickel silicide layer 116 is difficult and problems arise, for example, the contact resistance increases due to over-formation, a predetermined design value for surge current capability (IFSM) cannot be obtained, forward voltage (Vf) characteristics degrade, and the like.

Embodiments of a method of manufacturing a silicon carbide semiconductor device and a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are not repeatedly described. Further, in the present description, when Miller indices are described, "−" means a bar added to an index immediately after the "−", and a negative index is expressed by prefixing "−" to the index.

A structure of a silicon carbide semiconductor device according to an embodiment is described. FIG. 1 is a plan view depicting a layout when the silicon carbide semiconductor device according to the embodiment is viewed from a front side of a semiconductor substrate thereof. A silicon carbide semiconductor device 40 according to the embodiment depicted in FIG. 1 is a silicon carbide diode that has an active region 10 and in the active region 10, has a SBD structure (Schottky region 4) configured by a Schottky junction between a front electrode (first electrode) 14 (refer to FIG. 2) and the n-type semiconductor substrate 1, and a JBS structure (pn diode region 3) configured by a pn junction between a p-type well region 2 (refer to FIG. 2) and the n-type semiconductor substrate 1, in a front side of an n-type semiconductor substrate 1.

The Schottky regions 4 and the pn diode regions 3 (refer to FIG. 2) are disposed substantially evenly in a substantially uniform pattern at a surface of the active region 10. The Schottky regions 4 and the pn diode regions 3, for example, are disposed in a striped pattern and extend in a same direction parallel to a front surface of the n-type semiconductor substrate 1, the Schottky regions 4 and the pn diode regions 3 being disposed adjacently to and repeatedly alternating one another in a traverse direction orthogonal to a longitudinal direction in which the Schottky regions 4 and the pn diode regions 3 extend in the striped pattern.

The active region 10 is a region through which current flows when the silicon carbide diode is in an on-state. The active region 10, for example, has a substantially rectangular shape in a plan view and is disposed in substantially a center of the n-type semiconductor substrate 1. An edge termination region 30 is a region between the active region 10 and an end of the n-type semiconductor substrate 1; the edge termination region 30 surrounds the active region 10. The edge termination region 30 is a region that mitigates electric field of the front side of the n-type semiconductor substrate 1 and sustains a breakdown voltage. A breakdown voltage is a voltage limit at which no destruction or erroneous operation of a device occurs.

In the edge termination region 30, a voltage withstanding structure 15 such as a field limiting ring (FLR), a junction termination extension (JTE) structure, etc. is disposed. The JTE structure is a voltage withstanding structure having, in a plan view, a substantially rectangular shape surrounding a periphery of the active region 10 and in which multiple p-type regions of different impurity concentrations are disposed in descending order of impurity concentration in a direction from an inner side (center of the n-type semiconductor substrate 1) to an outer side (end of the n-type semiconductor substrate 1).

The front electrode 14 is provided on the front surface of the n-type semiconductor substrate 1, in the active region 10. The front electrode 14 is in contact with and electrically connected to the n-type semiconductor substrate 1 and the p-type well region 2.

Figure 2:
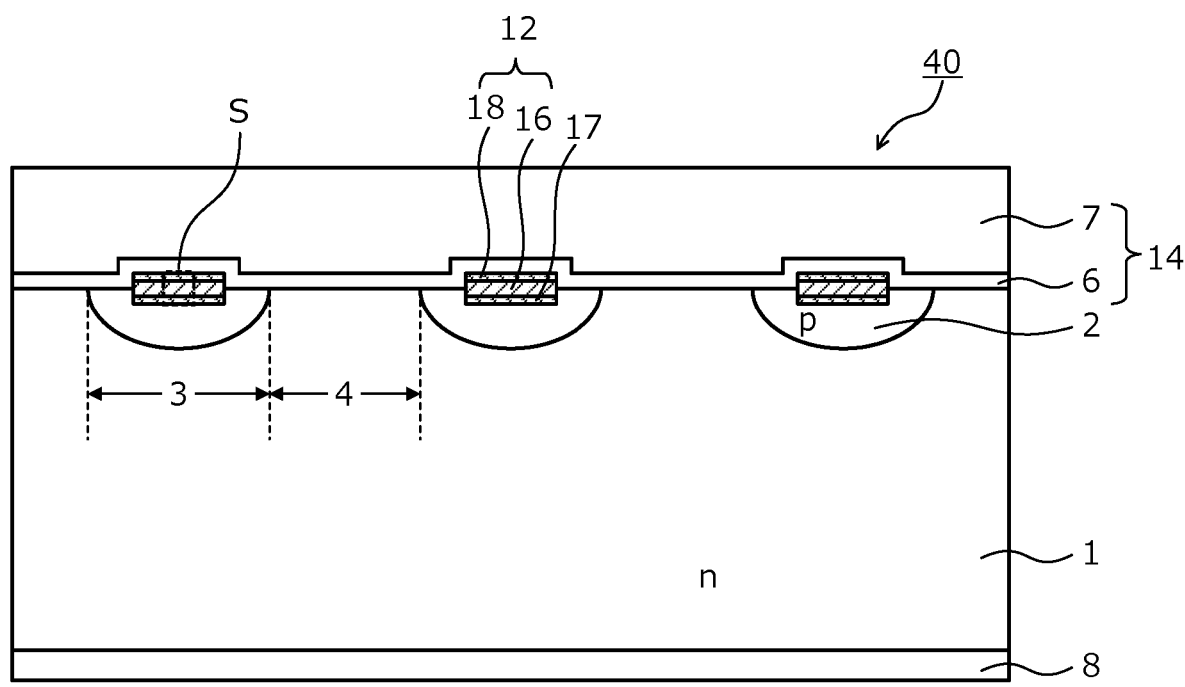
FIG. 2 is a cross-sectional view of a structure along cutting line A-A' in FIG. 1

Next, a cross-section of the structure of the silicon carbide semiconductor device 40 according to the embodiment is described. FIG. 2 is a cross-sectional view of the structure along cutting line A-A' in FIG. 1. As described above, the silicon carbide semiconductor device 40 according to the embodiment includes a JBS structure having a pn diode structure and an SBD structure of a silicon carbide diode in the active region 10 of the n-type semiconductor substrate 1 that contains silicon carbide; and the silicon carbide semiconductor device 40 has the voltage withstanding structure (not depicted) in the edge termination region 30.

The n-type semiconductor substrate 1 is an epitaxial substrate in which an n−-type epitaxial layer that constitutes an n−-type drift region is stacked on a front surface of an n+-type silicon carbide substrate containing silicon carbide. The n+-type silicon carbide substrate constitutes an n+-type cathode region. The n-type semiconductor substrate 1 has a main surface that is a surface of the n−-type epitaxial layer constituting the n−-type drift region and assumed as the front surface, and a main surface that is a back surface of the n+-type silicon carbide substrate and assumed as a back surface. In an entire area of the back surface (the back surface of the n+-type silicon carbide substrate) of the n-type semiconductor substrate 1, a cathode electrode (second electrode) 8 is provided electrically connected to the n+-type silicon carbide substrate.

The p-type well region 2 configures the pn diode structure and at least one p-type well region 2 is selectively provided in a surface region of the front side of the n-type semiconductor substrate 1. The p-type well region 2 is provided at the front surface of the n-type semiconductor substrate 1 and is exposed at the front surface of the n-type semiconductor substrate 1. The front electrode 14 is provided in an entire area of the front surface of the n-type semiconductor substrate 1.

The front electrode 14 has a stacked structure in which an anode electrode 7 and a Schottky metal 6 are stacked sequentially. Additionally, the front electrode 14 has an ohmic contact layer 12 that is a lowermost layer selectively provided between the front surface of the n-type semiconductor substrate 1 and the Schottky metal 6. In the p-type well region 2, a p$^+$-type region 17 having an impurity concentration that is higher than that of the p-type well region 2 is provided, and on the p$^+$-type region 17, the ohmic contact layer 12 is provided.

The ohmic contact layer 12, as described hereinafter, is formed in an area of contact between the p-type well region 2 and a metal material film (nickel layer 11 and Al region 22, refer to FIGS. 14 and 15) deposited on the front surface of the n-type semiconductor substrate 1, the ohmic contact layer 12 being formed by causing a surface region of the n-type semiconductor substrate 1 and the metal material film to react with each other by a heat treatment. Thus, the ohmic contact layer 12 is provided in the surface region of the front surface of the n-type semiconductor substrate 1, is in contact with the p$^+$-type region 17 in a depth direction and protrudes from the front surface of the n-type semiconductor substrate 1, in a direction away from the front surface of the n-type semiconductor substrate 1. The ohmic contact layer 12 is formed by a nickel silicide layer 16 provided on the p$^+$-type region 17 and a carbon compound layer 18 provided on the nickel silicide layer 16. Respective widths of the p$^+$-type region 17, the nickel silicide layer 16, and the carbon compound layer 18 are substantially equal to one another.

The Schottky metal 6 is provided in an entire area of the front surface of the n-type semiconductor substrate 1 and is in contact with the n-type semiconductor substrate 1 and the p-type well region 2. The Schottky metal 6 has areas that are in contact with the n-type semiconductor substrate 1 and that constitute the Schottky regions 4 that form Schottky junctions with the n-type semiconductor substrate 1. The Schottky metal 6 forms an ohmic contact with the p-type well region 2, via the ohmic contact layer 12. The anode electrode 7 covers an entire surface of the Schottky metal 6, is electrically connected to the Schottky metal 6, and is electrically connected to the ohmic contact layer 12, via the Schottky metal 6. The anode electrode 7 may be, for example, an aluminum-silicon (AlSi) film or an aluminum film.

Figure 3:
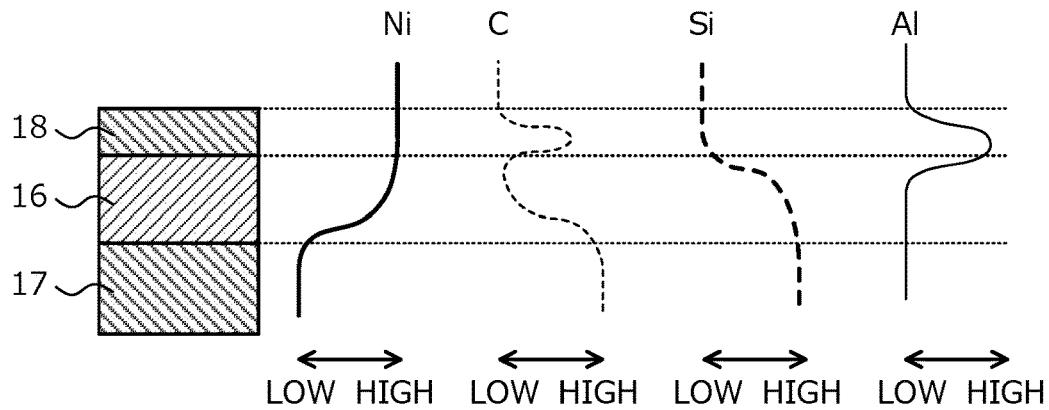
FIG. 3 is an enlarged cross-sectional view depicting a region S in FIG. 2 and a concentration profile thereof.

FIG. 3 is an enlarged cross-sectional view depicting a region S in FIG. 2 and a concentration profile thereof. FIG. 3 shows concentrations of nickel (Ni), carbon (C), silicon (Si), and aluminum (Al) from the surface of the carbon compound layer 18 to the p+-type region 17. As depicted in FIG. 3, the p+-type region 17 is a silicon carbide layer, has silicon and carbon as main components, and low concentrations of nickel and aluminum. On the other hand, the nickel silicide layer 16 and the carbon compound layer 18 of the ohmic contact layer 12 further contain nickel and aluminum, in addition to silicon and carbon. In particular, the nickel silicide layer 16 is formed by a nickel silicide and therefore, mainly contains nickel and silicon. The carbon compound layer 18 is mainly formed by nickel, carbon, and aluminum.

Compared to the nickel silicide layer 16, the carbon compound layer 18 has a lower concentration of silicon and a higher concentration of carbon and aluminum. In the carbon compound layer 18, concentrations of the carbon and the aluminum peak near the surface in contact with the nickel silicide layer 16.

This is due to aluminum being a metal that reacts with carbon and thus, when the nickel and silicon react in the nickel silicide layer 16, the excess carbon that occurs reacts with the aluminum and the carbon in the carbon compound layer 18 is trapped as $Al_3C$. As a result, precipitation of the excess carbon at the surface of the ohmic contact layer 12 is reduced.

In this manner, in the embodiment, a carbon-reactive metal is provided above the ohmic contact layer 12 and the amount thereof is controlled, whereby increased contact resistance due to over-formation of the nickel silicide layer 16 is suppressed, variations in characteristics due to stress and variations in shape due to variations in volume are suppressed, defects such as damage and interlayer peeling due to the occurrence of excess carbon are also suppressed, and contact resistance is reduced while Vf and IFSM characteristics may be enhanced.

Figure 4:
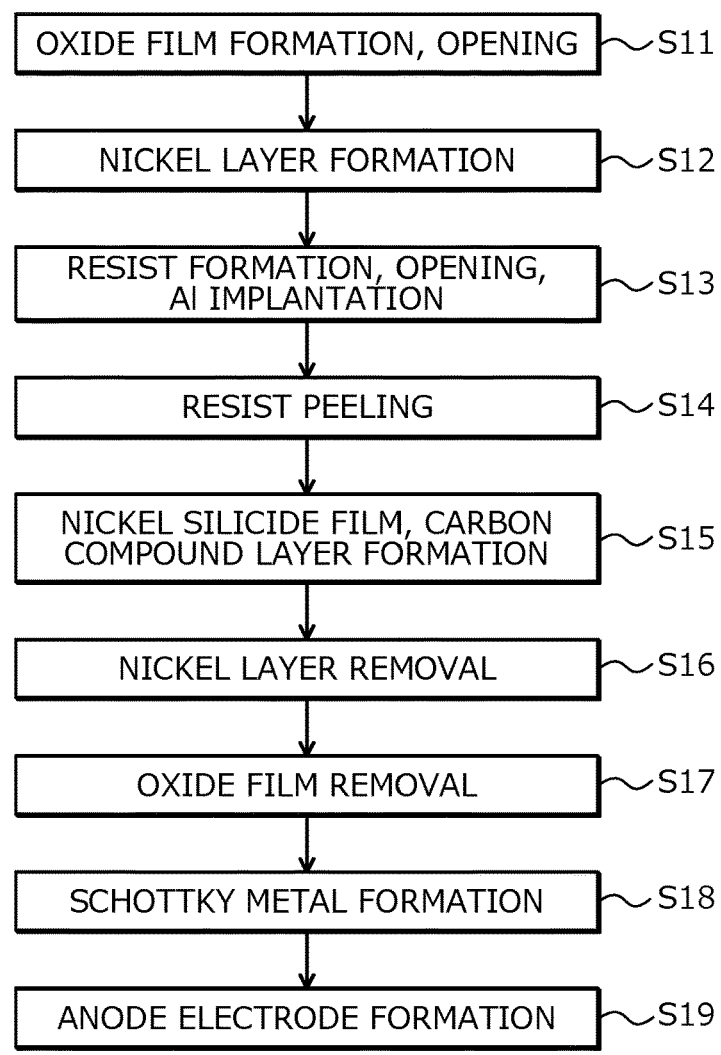
FIG. 4 is a flowchart of an outline of a first method of manufacturing the silicon carbide semiconductor device according to the embodiment.

Next, a method of manufacturing the silicon carbide semiconductor device 40 according to the embodiment is described. FIG. 4 is a flowchart of an outline of a first method of manufacturing the silicon carbide semiconductor device according to the embodiment. FIGS. 5, 6, 7, 8, 9, 10, 11, 12, and 13 are cross-sectional views depicting states of the silicon carbide semiconductor device according to the embodiment during manufacture by the first method of manufacturing. Formation of the ohmic contact layer 12 and subsequent processes are described in detail with reference to FIGS. 5 to 13.

First, a silicon carbide 4-layer periodic hexagonal crystal (4H—SiC) substrate doped with nitrogen (N) of a concentration of, for example, about $5\times10^{18}$/cm$^3$ is prepared as the n$^+$-type silicon carbide substrate (semiconductor wafer). The front surface of the n$^+$-type silicon carbide substrate, for example, may have an off-angle of about 4 degrees with respect to a (0001) plane. Next, on the front surface of the n$^+$-type silicon carbide substrate, the n$^-$-type epitaxial layer constituting the n$^-$-type drift region is grown and doped with nitrogen of a concentration of, for example, about $1.8\times10^{16}$/cm$^3$.

A thickness of the n$^+$-type silicon carbide substrate constituting the n$^+$-type cathode region may be, for example, about 350 μm. A thickness of the n$^-$-type epitaxial layer constituting the n$^-$-type drift region may be, for example, about 6 μm. By the processes up to here, the semiconductor substrate (semiconductor wafer) 1 in which the n$^-$-type epitaxial layer constituting the n$^-$-type drift region is stacked on the front surface of the n$^+$-type silicon carbide substrate is manufactured. As described above, the n-type semiconductor substrate 1 has a main surface (first main surface) that is a surface of the n$^-$-type drift region and a main surface (second main surface) that is the back surface of the n$^-$-type silicon carbide substrate.

Next, in the active region 10 (refer to FIG. 1), at least one p-type well region (first semiconductor region of a second conductivity type) 2 configuring the pn diode structure is selectively formed in a surface region of the front surface of the n-type semiconductor substrate 1, by photolithography and ion implantation of a p-type impurity such as aluminum. Multiple p-type well regions 2 are disposed at equal intervals, for example, intervals of about 2 μm, in a direction parallel to the front surface of the n-type semiconductor substrate 1.

Figure 5:
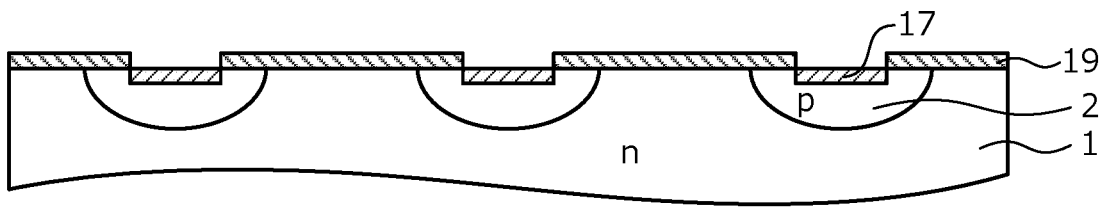
FIG. 5 is a cross-sectional view depicting a state of the silicon carbide semiconductor device according to the embodiment during manufacture by the first method of manufacturing.

Next, as depicted in FIG. 5, an oxide film 19 is formed in an entire area of the front surface of the n-type semiconductor substrate 1, and a resist (not-depicted) is formed on the oxide film 19. The oxide film 19 is formed by, for example, a thermal oxidation method and a chemical vapor deposition (CVD) method. Next, the oxide film 19 and resist are selectively removed by photolithography and etching to form an opening at each region where the p$^+$-type region 17 is to be formed (step S11). Next, a p-type impurity is implanted in each opening, thereby forming the p$^+$-type region (second semiconductor region of the second conductivity type) 17.

Next, the resist is peeled off and a heat treatment (activation annealing) for activating all regions formed by the ion implantation is performed. For example, a heat treatment (annealing) is performed under an inert gas atmosphere of about 1000 degrees C., thereby implementing an activation treatment for the p-type well regions 2 and the p$^+$-type regions 17. Ion implanted regions may be collectively activated by a single session of the heat treatment as described or may be activated by performing the heat treatment each time ion implantation is performed.

Figure 6:
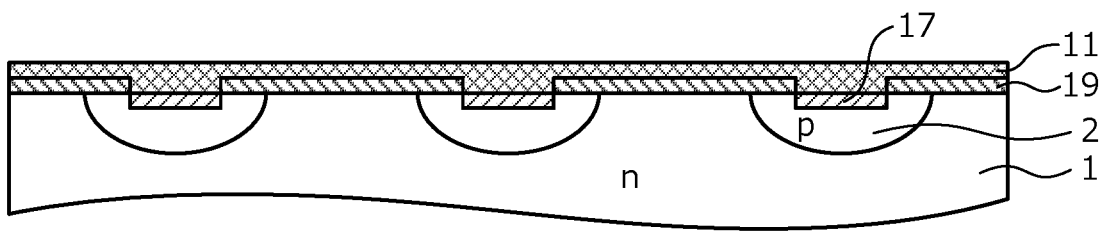
FIG. 6 is a cross-sectional view depicting a state of the silicon carbide semiconductor device according to the embodiment during manufacture by the first method of manufacturing.

Next, as depicted in FIG. 6, the nickel layer 11 is formed on an entire area of the front surface of the n-type semiconductor substrate 1 by, for example, a sputtering method (step S12). The nickel layer 11 is also formed in each opening of the oxide film 19 to be in contact with the p$^+$-type region 17.

Figure 7:
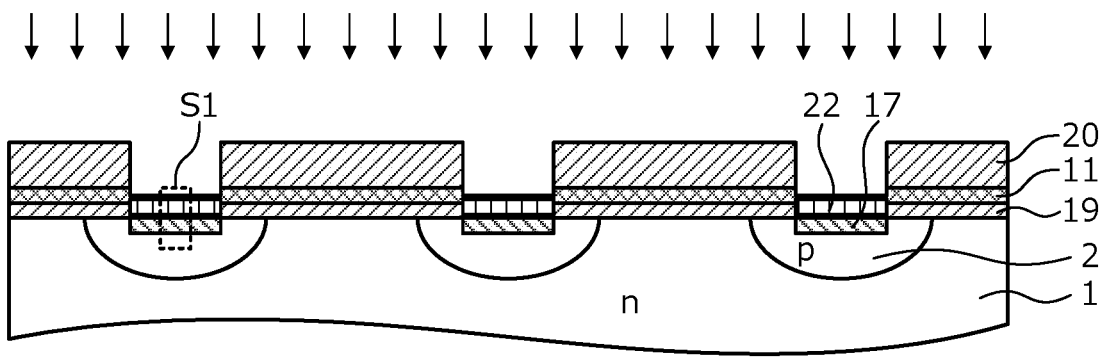
FIG. 7 is a cross-sectional view depicting a state of the silicon carbide semiconductor device according to the embodiment during manufacture by the first method of manufacturing.

Next, as depicted in FIG. 7, a resist 20 is formed in an entire area of the front surface of the n-type semiconductor substrate 1. Next, the resist 20 is selectively removed by photolithography to form an opening at each region where the p$^+$-type region 17 is formed. Next, aluminum is ion-implanted in each opening at a dosage in a range of $1 \times 10^{16}/cm^3$ to $1 \times 10^{17}/cm^3$, thereby forming the Al region 22 in the nickel layer 11 (step S13). Further, before the aluminum is ion-implanted, nickel may be ion-implanted in each opening at a dosage in a range of $1 \times 10^{15}/cm^3$ to $1 \times 10^{16}/cm^3$, whereby an Ni region (not-depicted) having a high concentration of nickel may be formed in the nickel layer 11.

Figure 14:
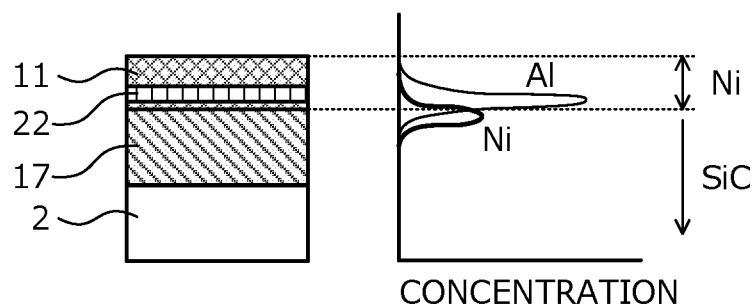
FIG. 14 is an enlarged cross-sectional view depicting the region S1 and a concentration profile of ion-implanted Ni and Al thereof after step S13 in an instance in which a nickel layer is thin.
Figure 15:
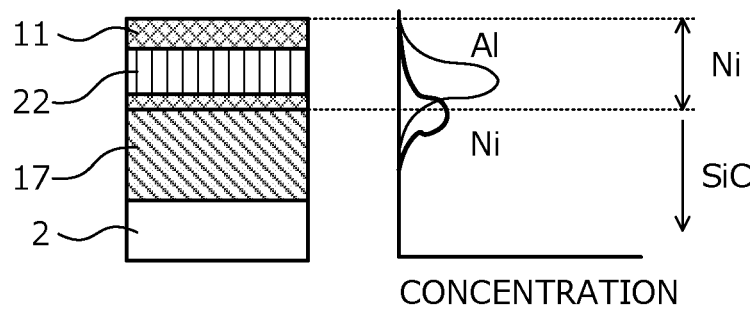
FIG. 15 is an enlarged cross-sectional view depicting the region S1 and a concentration profile of the ion-implanted Ni and Al thereof after step S13 in an instance in which the nickel layer is thick.

Here, FIG. 14 is an enlarged cross-sectional view depicting the region S1 and a concentration profile of the ion-implanted Ni and Al thereof after step S13 in an instance in which the nickel layer is thin. FIG. 15 is an enlarged cross-sectional view depicting the region S1 and a concentration profile of the ion-implanted Ni and Al thereof after step S13 in an instance in which the nickel layer is thick. FIGS. 14 and 15 show concentrations of the implanted aluminum and nickel from the surface of the nickel layer 11 to the p-type well region 2.

As depicted in FIGS. 14 and 15, aluminum is ion-implanted, whereby the Al region 22 is formed in the nickel layer 11. Here, the ion implantation is performed so that the concentration of the aluminum peaks in the nickel layer 11 and so that the aluminum is implanted into the p$^+$-type region 17. In other words, the aluminum is ion-implanted so as to span across an interface between the nickel layer 11 and the p$^+$-type region 17. Preferably, the concentration of the aluminum may peak in the nickel layer 11, near a side thereof facing the p$^+$-type region 17. On the other hand, when the nickel is ion-implanted, the ion-implantation is performed so that a Ni region (not-depicted) is formed spanning across the interface between the nickel layer 11 and the p$^+$-type region 17 and so that the concentration of the ion-implanted nickel peaks in the p$^+$-type region 17. Preferably, the concentration of the ion-implanted nickel may peak in the p$^+$-type region 17, near the side thereof facing the nickel layer 11.

Here, preferably, the thickness of the nickel layer 11 may be in a range of 0.1 μm to 0.5 μm. In an instance in which the thickness of the nickel layer 11 is thin like in FIG. 14, for example, 0.2 μm or less, special high-acceleration ion implanting equipment is unnecessary and accurate implantation near the interface between the nickel layer 11 and the p$^+$-type region 17 may be achieved with normal ion implanting equipment, further enabling variation to be reduced, whereby the halfwidth of the concentration of aluminum is reduced and the concentration of the aluminum may be set to peak near the interface between the nickel layer 11 and the p$^+$-type region 17. On the other hand, in an instance in which the thickness of the nickel layer 11 thick like in FIG. 15, for example, in a range of 0.2 μm to 0.5 μm, the aluminum enters deeply into the p$^+$-type region 17 and therefore, contact resistance may be reduced. Nonetheless, in instances of 0.5 μm or greater, high-acceleration ion implanting equipment is necessary, variation of the implantation near the interface between the nickel layer 11 and the p$^+$-type region 17 increases, and the peak concentration of the aluminum decreases, whereby variation of the finished product increases and thus, is undesirable. In an instance in which the thickness of the nickel layer 11 is to be increased, the nickel layer 11 may be thinly stacked, ion implantation may be performed, and a nickel layer may be further stacked thereon, whereby effects similar to those in an instance in which the thickness of the nickel layer 11 is thin are obtained.

In this manner, in the embodiment, after the nickel layer 11 is stacked, Al ion-implantation for forming the carbon compound layer 18 is performed so that the aluminum reaches the p$^+$-type region 17, whereby formation of the nickel silicide layer 16 is facilitated by ion implantation damage and the annealing temperature may be reduced. Further, the aluminum concentration at the surface of the p$^+$-type region 17 increases, whereby ohmic contact with the nickel silicide layer 16 is facilitated. Further, due to the ion implantation of nickel, nickel is ion-implanted near the interface between the p$^+$-type region 17 and the nickel layer 11, thereby facilitating formation of the nickel silicide layer 16.

Further, when the aluminum is ion-implanted, depending on the method of manufacturing, it may be preferable for 5% to 20% of the implanted aluminum to reach the interface between the p$^+$-type region 17 and the nickel layer 11. Further, to ensure the thickness of the nickel silicide layer 16 and facilitate implantation near the interface between the nickel layer 11 and the p$^+$-type region 17, the thickness of the nickel layer 11 may be reduced and the ion implantation acceleration voltage may be further lowered, whereby variation of the aluminum due to ion-implantation of the aluminum may be suppressed and accurate formation becomes possible. As a result, even with ion implantation in which the amount of metal is low compared to stacked metal layers, it is possible to cause efficient reaction.

Further, the thickness of the nickel layer 11 is reduced and the nickel is ion-implanted so as to span across the interface between the nickel layer 11 and the p$^+$-type region 17, whereby formation of the nickel silicide layer 16 is facilitated, variation of aluminum in the Al region 22 is suppressed, and accurate formation becomes possible. Further, while formation by injecting an inert gas instead of nickel is possible, in this case, it is preferable for the inert gas to not reach the p$^+$-type region 17. Further, dynamic mixing in which nickel is implanted while the nickel layer 11 is stacked is possible; and in this case, the thickness of the nickel layer 11 may be minimized.

Figure 8:
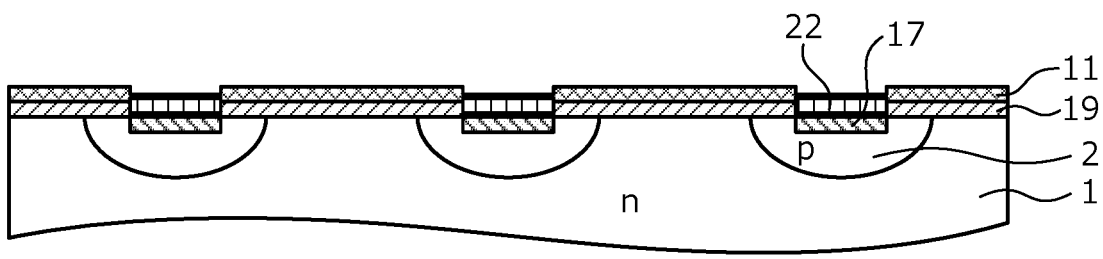
FIG. 8 is a cross-sectional view depicting a state of the silicon carbide semiconductor device according to the embodiment during manufacture by the first method of manufacturing.
Figure 9:
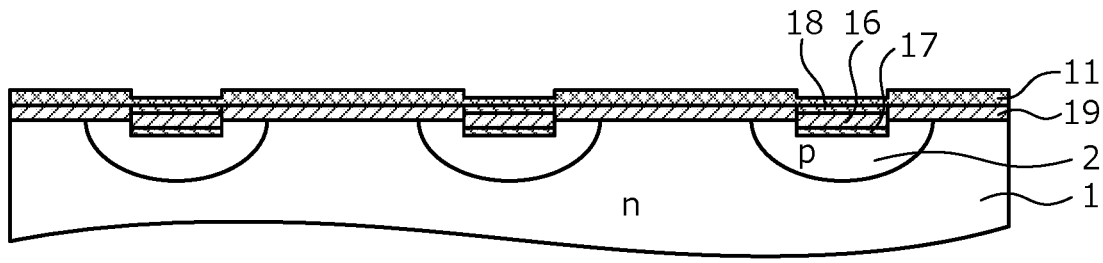
FIG. 9 is a cross-sectional view depicting a state of the silicon carbide semiconductor device according to the embodiment during manufacture by the first method of manufacturing.

Next, as depicted in FIG. 8, the resist is peeled off (step S14). Next, as depicted in FIG. 9, annealing (heat treatment) is performed at a temperature in a range of 600 degrees C. to 1000 degrees C. As a result, silicon atoms in the semiconductor substrate and nickel atoms in the aluminum-nickel compound layer react and are converted into a silicide to form an ohmic contact with the p$^+$-type region 17, whereby the nickel silicide (NiSi) layer 16 constituting the ohmic electrode and the carbon compound layer 18 are formed (step S15).

In the area of contact between the nickel layer 11 and the p$^+$-type region 17, the silicon atoms in the n-type semiconductor substrate 1 are thermally diffused into the nickel layer 11 by the heat treatment at step S15. The nickel silicide layer 16 is generated in the nickel layer 11 by this silicide reaction. Due to the silicide reaction, carbon that remains in the n-type semiconductor substrate 1 (hereinafter, excess carbon) bonds with the carbon-reactive metal aluminum in the Al region 22, thereby generating the carbon compound layer 18, whereby the ohmic contact layer 12 depicted in FIG. 3 is formed.

Figure 10:
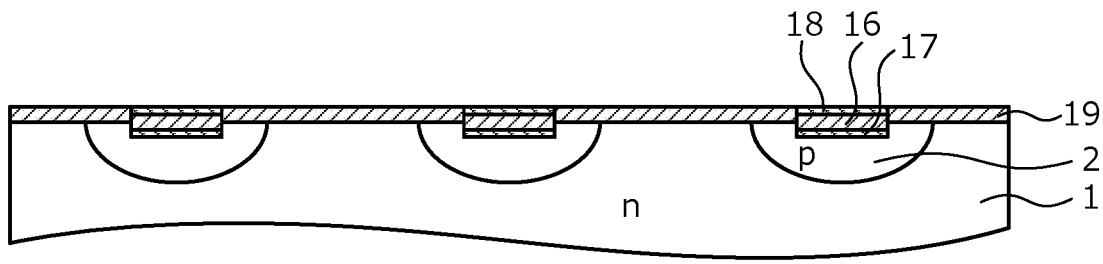
FIG. 10 is a cross-sectional view depicting a state of the silicon carbide semiconductor device according to the embodiment during manufacture by the first method of manufacturing.
Figure 11:
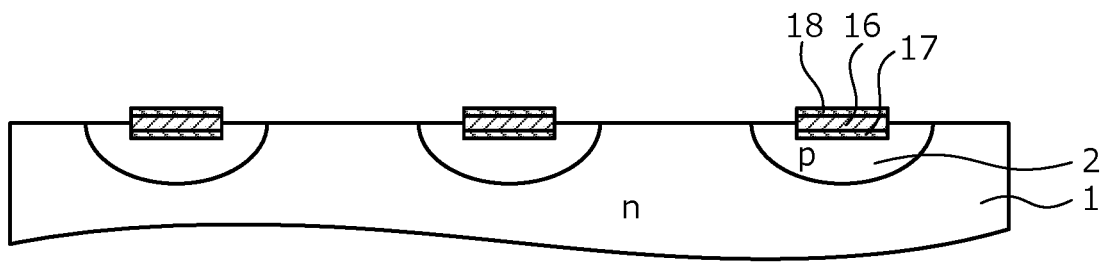
FIG. 11 is a cross-sectional view depicting a state of the silicon carbide semiconductor device according to the embodiment during manufacture by the first method of manufacturing.
Figure 12:
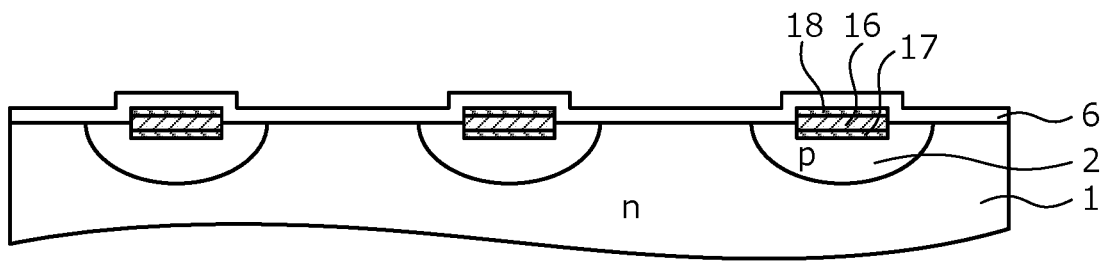
FIG. 12 is a cross-sectional view depicting a state of the silicon carbide semiconductor device according to the embodiment during manufacture by the first method of manufacturing.
Figure 13:
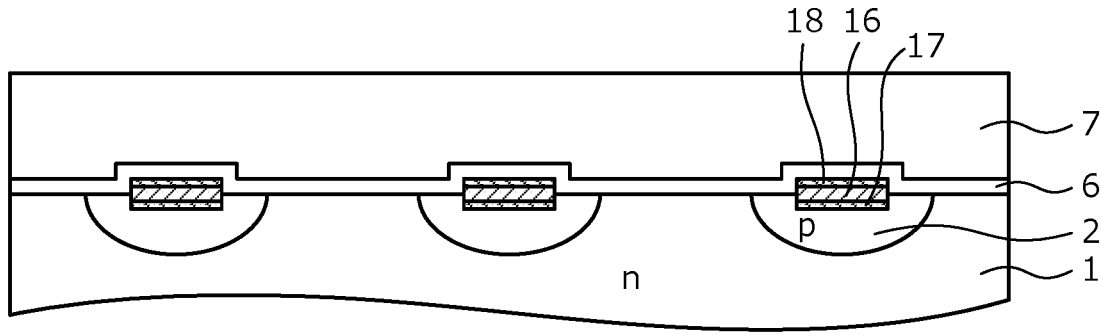
FIG. 13 is a cross-sectional view depicting a state of the silicon carbide semiconductor device according to the embodiment during manufacture by the first method of manufacturing.

Next, as depicted in FIG. 10, the nickel layer 11 that remains unreacted is removed (step S16). Here, while the ohmic contact layer 12 is formed by a single session of the heat treatment, the unreacted nickel layer 11 may be removed by a first session of the heat treatment and a second session of the heat treatment may be performed at temperature higher than that of the first session, whereby contact resistance may be reduced. In the process at step S16, for example, an entire area of the front surface of the n-type semiconductor substrate 1 is etched by wet etching using a mixed solution of phosphoric acid, nitric acid, and acetic acid. Next, as depicted in FIG. 11, the oxide film 19 is removed (step S17). Next, as depicted in FIG. 12, the Schottky metal 6 is formed in an entire area of the front surface of the n-type semiconductor substrate 1 by, for example, a sputtering method (step S18). Next, as depicted in FIG. 13, the anode electrode 7 is formed on the surface of the Schottky metal 6 (step S19).

Next, the front surface of the n-type semiconductor substrate 1 (semiconductor wafer) is protected with a protective film (not-depicted) and thereafter, the n-type semiconductor substrate 1 is ground from the back surface, whereby the n-type semiconductor substrate 1 is thinned to a product thickness. Next, nickel, titanium, etc. is formed in an entire area of the back surface of the n-type semiconductor substrate 1 (back surface of the n+-type silicon carbide substrate) by, for example, a physical vapor deposition method such as sputtering and thereafter, laser annealing is performed, whereby the cathode electrode 8 is formed. Thereafter, the protective film on the front surface of the n-type semiconductor substrate 1 is removed and then, the n-type semiconductor substrate 1 is diced (cut) into individual chips, whereby the silicon carbide semiconductor device 40 depicted in FIGS. 1 and 2 is completed.

Figure 16:
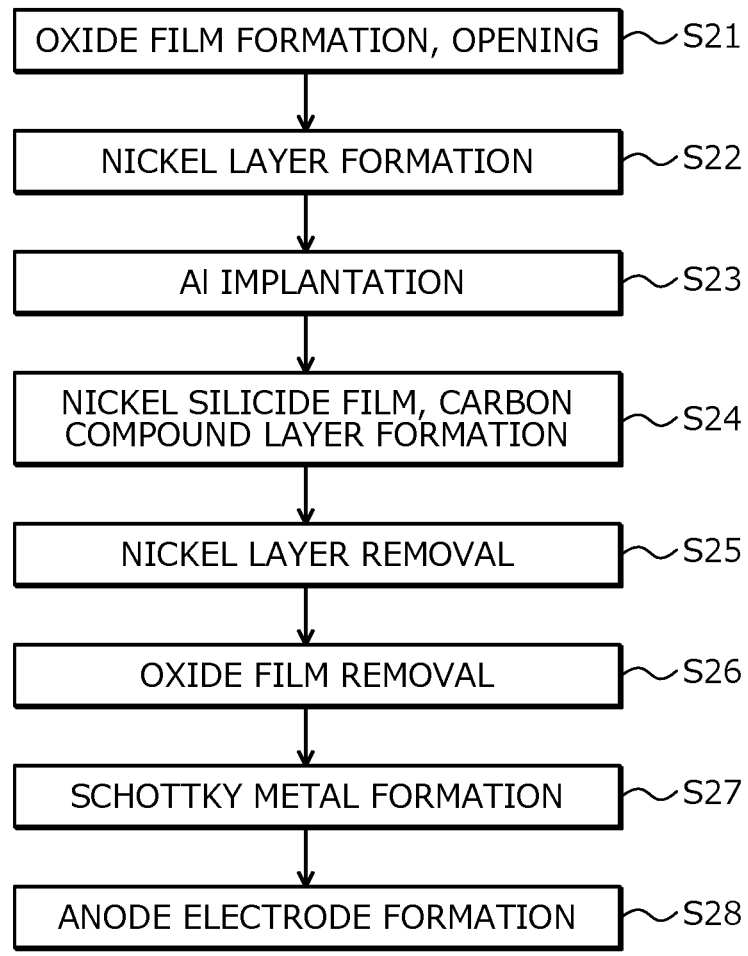
FIG. 16 is a flowchart of an outline of a second method of manufacturing the silicon carbide semiconductor device according to the embodiment.
Figure 17:
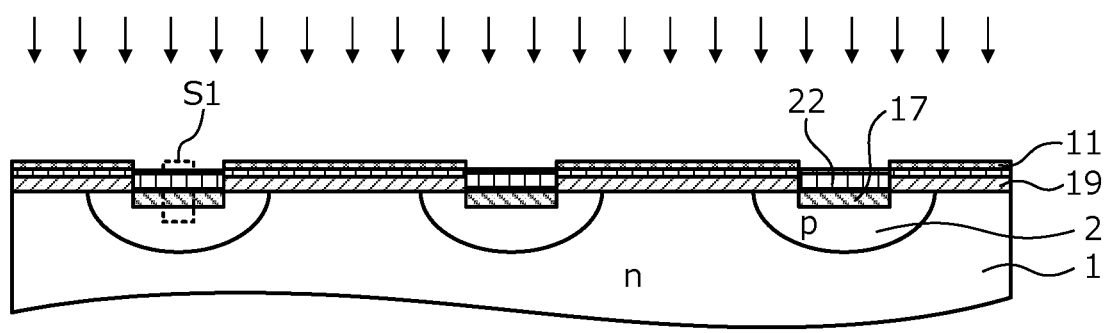
FIG. 17 is a cross-sectional view depicting a state of the silicon carbide semiconductor device according to the embodiment during manufacture according to the second method of manufacturing.
Figure 18:
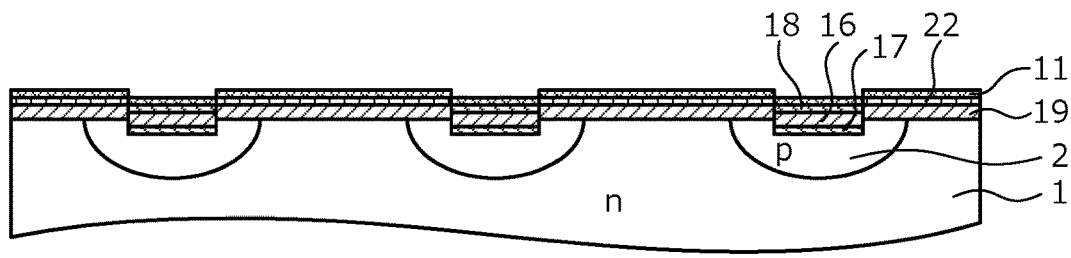
FIG. 18 is a cross-sectional view depicting a state of the silicon carbide semiconductor device according to the embodiment during manufacture according to the second method of manufacturing.

Next, a second method of manufacturing the silicon carbide semiconductor device according to the embodiment is described. FIG. 16 is a flowchart of an outline of the second method of manufacturing the silicon carbide semiconductor device according to the embodiment. FIGS. 17 and 18 are cross-sectional views depicting states of the silicon carbide semiconductor device according to the embodiment during manufacture according to the second method of manufacturing. Here, figures identical to those of the first method of manufacturing are omitted and description is given with reference to the figures of the first method of manufacturing.

The second method of manufacturing differs from the first method of manufacturing in that when the aluminum is ion-implanted, formation and peeling off of the resist 20 are not performed and by reducing the labor and manufacturing time here, manufacture by less labor and time than that of the first method of manufacturing is possible. First, the processes up through selectively forming the p-type well region 2 are performed similarly to the first method of manufacturing.

Next, as depicted in FIG. 5, the oxide film 19 is formed in an entire area of the front surface of the n-type semiconductor substrate 1, and a resist (not-depicted) is formed on the oxide film 19. The oxide film 19 is formed by, for example, a thermal oxidation method and a chemical vapor deposition method. Next, the oxide film 19 and the resist are selectively removed by photolithography and etching to form an opening at each region where the p$^+$-type region 17 is to be formed (step S21). Next, in each opening, a p-type impurity is implanted, thereby forming the p$^+$-type region 17.

Next, the resist is peeled off and a heat treatment (activation annealing) for activating all regions formed by ion implantation is performed. For example, a heat treatment (annealing) is performed under an inert gas atmosphere of about 1000 degrees C., thereby implementing an activation treatment for the p-type well regions 2 and the p$^+$-type regions 17. As described above, ion implanted regions may be collectively activated by a single session of the heat treatment or may be activated by performing the heat treatment each time ion implantation is performed.

Next, as depicted in FIG. 6, the nickel layer 11 is formed in an entire area of the front surface of the n-type semiconductor substrate 1 by, for example, a sputtering method (step S22). The nickel layer 11 is also formed in each opening of the oxide film 19 to be in contact with the p$^+$-type region 17.

Next, as depicted in FIG. 17, aluminum is ion-implanted in an entire area of the surface of the nickel layer 11, whereby the Al region 22 is formed in the nickel layer 11 (step S23). Further, before the ion-implantation of the aluminum, nickel may be ion-implanted in each opening, whereby Ni regions (not-depicted) may be formed in the nickel layer 11. Here, an enlarged cross-sectional view of the region S1 and Ni and Al concentration profiles thereof are identical to those of the first method of manufacturing.

In the second method of manufacturing, the resist 20 is not provided and therefore, the Al region 22 is formed in the nickel layer 11, at the entire surface of the nickel layer 11. The aluminum is further implanted at an interface between the n-type semiconductor substrate 1 and the nickel layer 11.

Next, as depicted in FIG. 18, silicon atoms in the semiconductor substrate and nickel atoms in the aluminum-nickel compound layer are caused to react and form a silicide by annealing (heat treatment), whereby the nickel silicide (NiSi) layer 16 constituting an ohmic electrode that is in ohmic contact with the p$^+$-type region 17 and the carbon compound layer 18 are formed (step S24).

Next, as depicted in FIG. 10, the unreacted nickel layer 11 is removed (step S25). In the process at step S25, for example, an entire area of the front surface of the n-type semiconductor substrate 1 is etched by wet etching using a mixed solution of phosphoric acid, nitric acid, and acetic acid. Next, as depicted in FIG. 11, the oxide film 19 is removed (step S26). Next, as depicted in FIG. 12, the Schottky metal 6 is formed on an entire area of the front surface of the n-type semiconductor substrate 1 by, for example, a sputtering method (step S27). Next, as depicted in FIG. 13, the anode electrode 7 is formed on the surface of the Schottky metal 6 (step S28).

Next, the front surface of the n-type semiconductor substrate 1 (semiconductor wafer) is protected by a protective film (not-depicted) and thereafter, the n-type semiconductor substrate 1 is ground from the back surface, whereby the n-type semiconductor substrate 1 is thinned to a product thickness. Next, nickel, titanium, etc. is formed in an entire area of the back surface of the n-type semiconductor substrate 1 (back surface of the n+-type silicon carbide substrate) by, for example, a physical vapor deposition method such as sputtering and thereafter, laser annealing is performed, whereby the cathode electrode 8 is formed. Thereafter, the protective film on the front surface of the n-type semiconductor substrate 1 is removed and then, the n-type semiconductor substrate 1 is diced (cut) into individual chips, whereby the silicon carbide semiconductor device 40 depicted in FIGS. 1 and 2 is completed.

Figure 19:
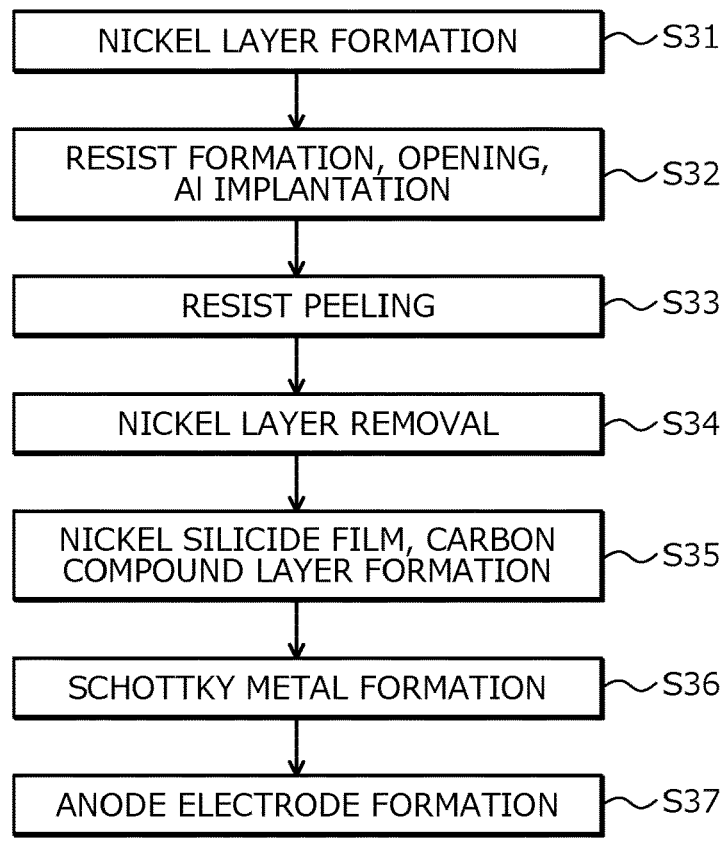
FIG. 19 is a flowchart of an outline of a third method of manufacturing the silicon carbide semiconductor device according to the embodiment.

Next, a third method of manufacturing the silicon carbide semiconductor device according to the embodiment is described. FIG. 19 is a flowchart of an outline of the third method of manufacturing the silicon carbide semiconductor device according to the embodiment. FIGS. 20, 21, 22, and 23 are cross-sectional views depicting states of the silicon carbide semiconductor device according to the embodiment during manufacture according to the third method of manufacturing. Here, figures identical to those of the first method of manufacturing are omitted and description is given with reference to the figures of the first method of manufacturing.

The third method of manufacturing differs from the first method of manufacturing in that when the aluminum is ion-implanted, formation and peeling off of the oxide film 19 are not performed and by reducing the labor and manufacturing time here, manufacture by less labor and time than that of the first method of manufacturing is possible. First, the processes up through selectively forming the p-type well region 2 are performed similarly to the first method of manufacturing.

Figure 20:
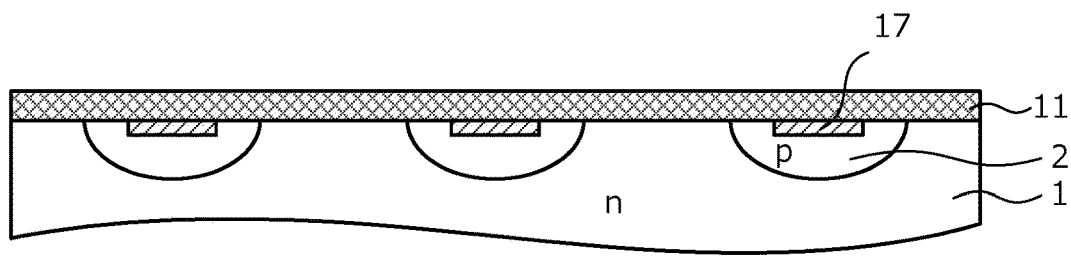
FIG. 20 is a cross-sectional view depicting a state of the silicon carbide semiconductor device according to the embodiment during manufacture according to the third method of manufacturing.

Next, as depicted in FIG. 20 the nickel layer 11 is formed in an entire area of the front surface of the n-type semiconductor substrate 1 by, for example, a sputtering method (step S31). The nickel layer 11 is in contact with each $p^+$-type region 17.

Figure 21:
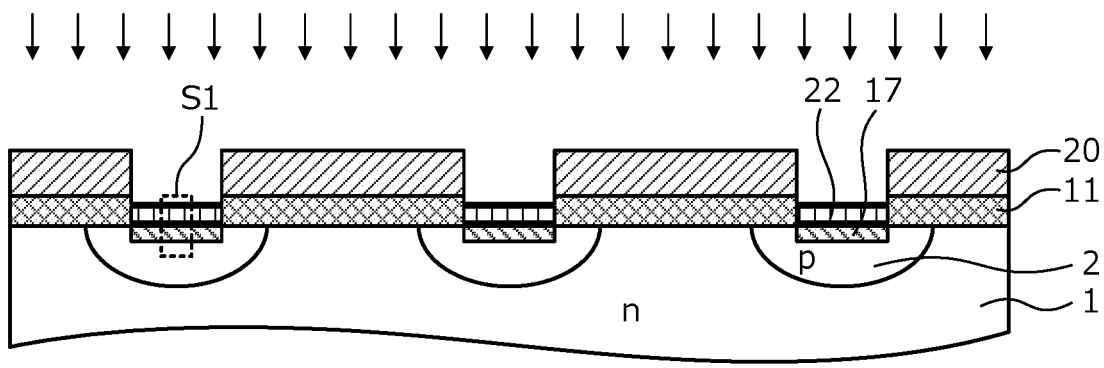
FIG. 21 is a cross-sectional view depicting a state of the silicon carbide semiconductor device according to the embodiment during manufacture according to the third method of manufacturing.

Next, as depicted in FIG. 21, the resist 20 is formed in an entire area of the front surface of the n-type semiconductor substrate 1. Next, the resist 20 is selectively removed by photolithography to form an opening at each region where the $p^+$-type region 17 is formed. Next, aluminum is ion-implanted in each opening, whereby the Al region 22 is formed in the nickel layer 11 (step S32). Further, before the ion-implantation of the aluminum, nickel may be ion-implanted in each opening, whereby Ni regions (not-depicted) may be formed in the nickel layer 11. Here, an enlarged cross-sectional view of the region S1 and Ni and Al concentration profiles thereof are identical to those of the first method of manufacturing.

Figure 22:
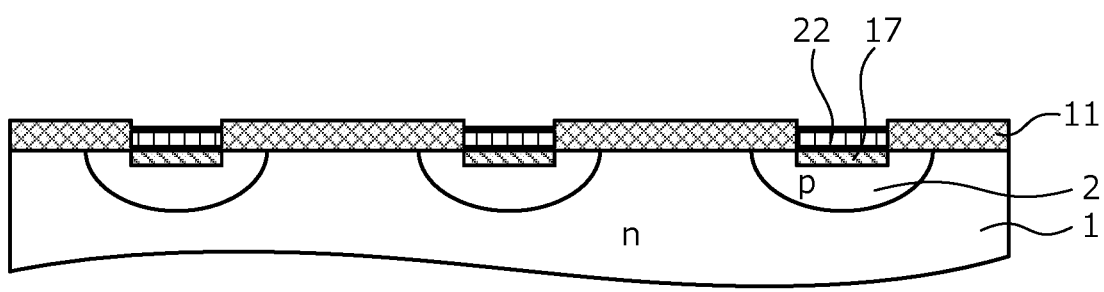
FIG. 22 is a cross-sectional view depicting a state of the silicon carbide semiconductor device according to the embodiment during manufacture according to the third method of manufacturing.
Figure 23:
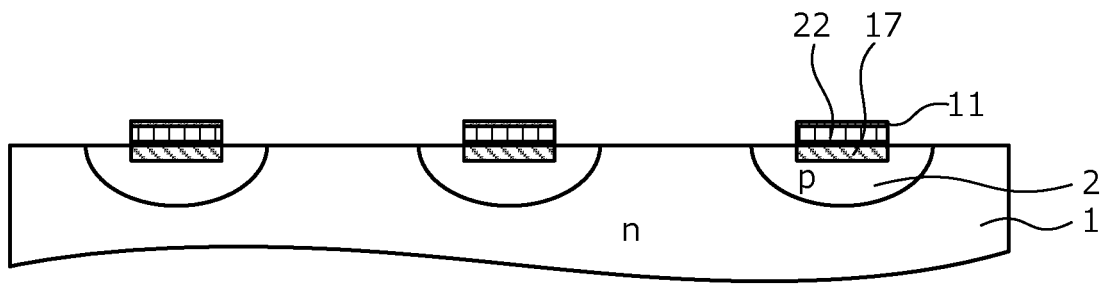
FIG. 23 is a cross-sectional view depicting a state of the silicon carbide semiconductor device according to the embodiment during manufacture according to the third method of manufacturing.
Figure 24:
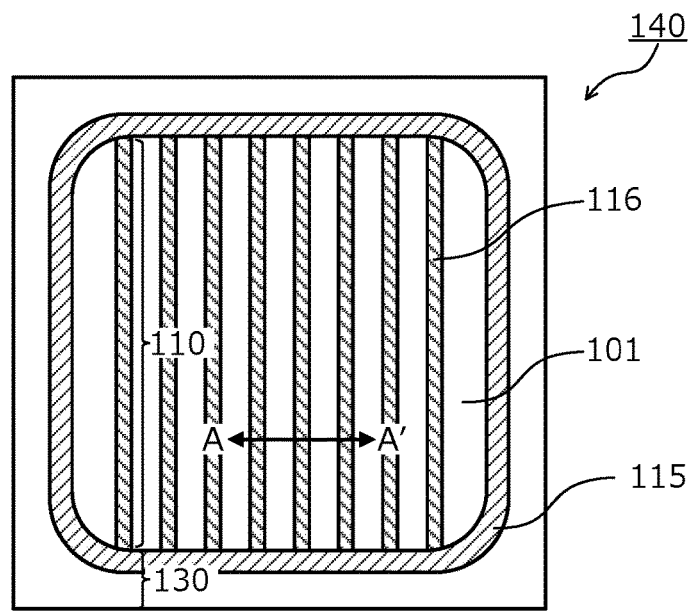
FIG. 24 is a plan view depicting a layout when a conventional silicon carbide semiconductor device is viewed from a front side of a semiconductor substrate thereof.
Figure 25:
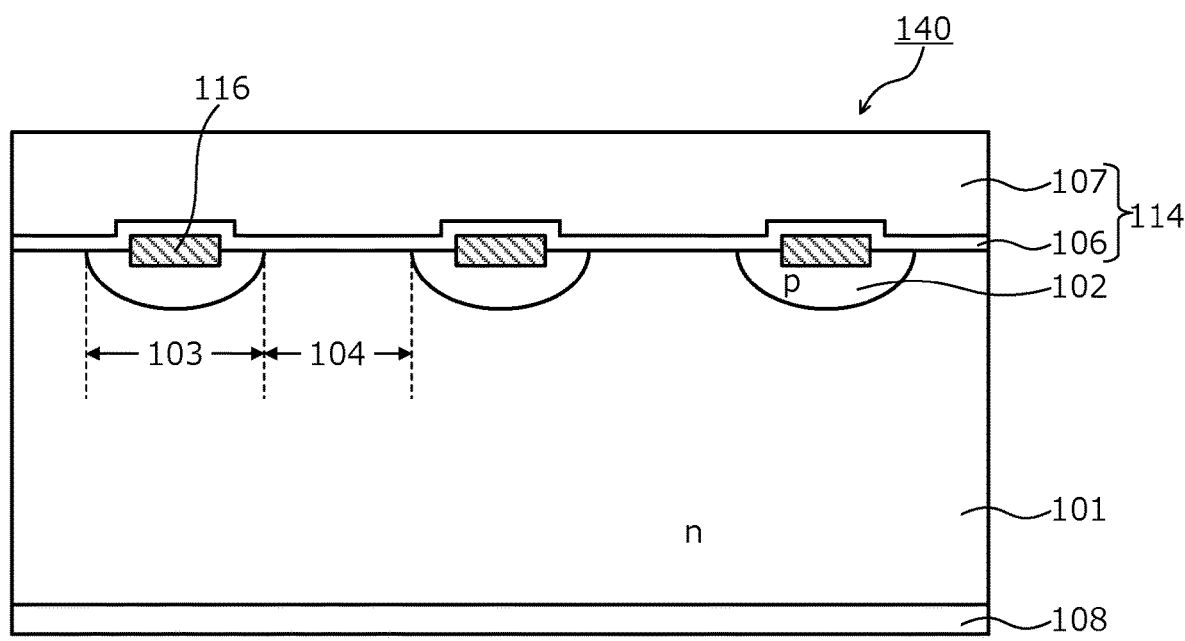
FIG. 25 is a cross-sectional view depicting a structure along cutting line A-A' in FIG. 24.
Figure 26:
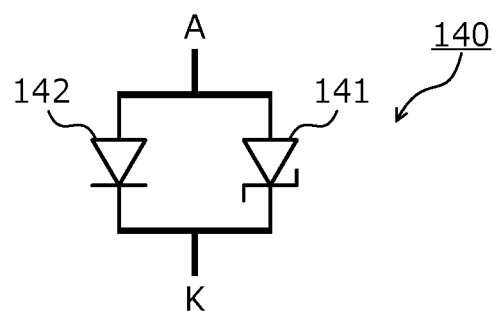
FIG. 26 is a circuit diagram of a SBD of a JBS structure.

Next, as depicted in FIG. 22, the resist 20 is peeled off (step S33). Next, as depicted in FIG. 23, the nickel layer 11 is removed except for portions thereof on the Al regions 22 (step S34). Next, as depicted in FIG. 11, silicon atoms in the semiconductor substrate and nickel atoms in the aluminum-nickel compound layer are caused to react and form a silicide by annealing (heat treatment), whereby the nickel silicide (NiSi) layer 16 constituting an ohmic electrode that is in contact with the $p^+$-type region 17 and the carbon compound layer 18 are formed (step S35).

Next, as depicted in FIG. 12, the Schottky metal 6 is formed in an entire area of the front surface of the n-type semiconductor substrate 1 by, for example, a sputtering method (step S36). Next, as depicted in FIG. 13, the anode electrode 7 is formed on the surface of the Schottky metal 6 (step S37).

Next, after the front surface of the n-type semiconductor substrate 1 (semiconductor wafer) is covered with a protective film (not-depicted) and protected, the n-type semiconductor substrate 1 is ground from the back surface, whereby the n-type semiconductor substrate 1 is thinned to a product thickness. Next, nickel, titanium, etc. is formed in an entire area of the back surface of the n-type semiconductor substrate 1 (back surface of the n+-type silicon carbide substrate) by, for example, a physical vapor deposition method such as sputtering and thereafter, laser annealing is performed, whereby the cathode electrode 8 is formed. Thereafter, the protective film on the front surface of the n-type semiconductor substrate 1 is removed and then, the n-type semiconductor substrate 1 is diced (cut) into individual chips, whereby the silicon carbide semiconductor device 40 depicted in FIGS. 1 and 2 is completed. Further, in the embodiment, while a silicon carbide diode having a JBS structure is described, the present invention is applicable to a front electrode of a SiC-MOSFET. An n-type source region of the MOSFET contains a nickel silicide, the carbon layer is formed, and while the front electrode is in a state of easily peeling off, the front electrode is not provided on the entire surface like a Schottky diode and therefore, peeling of the front electrode is rare. Nonetheless, in the n-type source region, Al ion-implantation is performed, forming the Al region, and the carbon compound layer is generated by annealing, whereby peeling of the front electrode due to excess carbon may be prevented. In an instance in which the ion-implantation is performed to the entire surface including that of the n-type source region, low-cost manufacturing is possible without increases in labor such as for photolithography. Further, in an instance in which photolithography is performed and ion-implantation is performed only in a $p^+$-type contact region without ion-implantation in the n-type source region, effects including the low contact resistance with the n-type source region being maintained while the contact resistance of the $p^+$-type contact region is reduced are obtained. Furthermore, Ti or the like is ion-implanted so as to reach an interface of the n-type source region, whereby the formation temperature of a Ti-silicide is also reduced.

As described above, according to the embodiment, a carbon-reactive metal is provided above the ohmic contact layer and the amount thereof is controlled, whereby increased contact resistance due to over-formation of the nickel silicide layer, shape variations due to volume variations, and variation of characteristics due to stress are suppressed, defects such as damage and interlayer peeling due to the occurrence of excess carbon are also suppressed, contact resistance is reduced, and Vf and IFSM characteristics may be enhanced.

Further, after the nickel layer is stacked, the Al ion-implantation for forming the carbon compound layer is performed so that the aluminum reaches the p+-type region, whereby formation of the nickel silicide layer by ion-implantation damage is facilitated and the annealing temperature may be reduced. Further, ohmic contact with the nickel silicide layer is facilitated by increasing the aluminum concentration at the surface of the p+-type region. Further, by ion-implanting nickel, nickel is ion-implanted near the interface between the p+-type region and the nickel layer, thereby facilitating formation of the nickel silicide layer.

In the foregoing, the present invention is not limited to the embodiments described above and various modifications within a range not departing from the spirit of the invention are possible and application is possible to a silicon carbide semiconductor device that includes an ohmic electrode in ohmic contact with p-type regions disposed in a predetermined pattern.

In particular, for example, the present invention is useful for silicon carbide semiconductor devices configured to reduce the contact resistance between a p-type region (or a p+-type contact region disposed between the p-type region and a main surface of a semiconductor substrate) and an ohmic electrode, and silicon carbide semiconductor devices with a structure in which an oxide film is in contact with an ohmic electrode that is in ohmic contact with a p-type region.

According to the invention described above, the carbon-reactive metal is provided above the ohmic contact layer and the amount thereof is controlled, whereby increased contact resistance due to over-formation of the nickel silicide layer, shape variations due to volume variations, and variation of characteristics due to stress are suppressed, defects such as damage and interlayer peeling due to the occurrence of excess carbon are also suppressed, contact resistance is reduced, and Vf and IFSM characteristics may be enhanced.

Further, after the nickel layer is stacked, Al ion-implantation for forming the carbon compound layer is performed so that the aluminum reaches the $p^+$-type region (second semiconductor region of the second conductivity type), whereby formation of the nickel silicide layer by ion-implantation damage is facilitated and the annealing temperature may be reduced. Further, ohmic contact with the nickel silicide layer is facilitated by increasing the aluminum concentration at the surface of the $p^+$-type region. Further, by ion-implanting nickel, nickel is ion-implanted near the interface between the $p^+$-type region and the nickel layer, thereby facilitating formation of the nickel silicide layer. The method of manufacturing a silicon carbide semiconductor device and a silicon carbide semiconductor device according to the invention achieve an effect in that when an ohmic contact is formed, interlayer peeling due to excess carbon is prevented, reduced contact resistance is facilitated, and Vf and IFSM characteristics may be enhanced.

As described, the method of manufacturing a silicon carbide semiconductor device and a silicon carbide semiconductor device according to the present invention are useful for power semiconductor devices used in power converting equipment, power source devices such as those of various types of industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
    a semiconductor substrate containing silicon carbide, the semiconductor substrate having a first main surface and a second main surface opposite to each other;
    a semiconductor region of a conductivity type, selectively provided in the semiconductor substrate, at the first main surface of the semiconductor substrate;
    an ohmic contact layer in ohmic contact with the semiconductor region;
    a first electrode in contact with the ohmic contact layer, the semiconductor region, and the semiconductor substrate; and
    a second electrode provided on the second main surface of the semiconductor substrate, wherein
    the ohmic contact layer is configured by a nickel silicide layer in contact with the semiconductor region, and a carbon compound layer provided on the nickel silicide layer, and
    each of the nickel silicide layer and the carbon compound layer contains aluminum, a concentration of the aluminum in the carbon compound layer being higher than a concentration of the aluminum in the nickel silicide layer.

2. The silicon carbide semiconductor device according to claim 1, wherein
    the concentration of the aluminum in the carbon compound layer has a peak thereof in the nickel silicide layer, substantially at an interface between the nickel silicide layer and the carbon compound layer.

3. A method of manufacturing the silicon carbide semiconductor device according to claim 1, the method comprising:
    preparing the semiconductor substrate;
    selectively forming the semiconductor region of a conductivity type in the semiconductor substrate, at the first main surface of the semiconductor substrate;
    forming the nickel layer above the semiconductor region;
    ion-implanting aluminum in the nickel layer;
    performing a heat treatment to the nickel layer implanted with the aluminum, to thereby form the ohmic contact layer that is in ohmic contact with the semiconductor region;
    forming the first electrode that is in contact with the ohmic contact layer, the semiconductor region, and the semiconductor substrate; and
    forming the second electrode on the second main surface of the semiconductor substrate.

4. The method according to claim 3, wherein said selectively forming the semiconductor region of the conductivity type includes:
    selectively forming, at the first main surface of the semiconductor substrate, a first semiconductor region of the conductivity type, and
thereafter, selectively forming, at a surface of the first semiconductor region, a second semiconductor region of the conductivity type, wherein
the semiconductor region is configured by the first semiconductor region and the second semiconductor region, and
the second semiconductor region has an impurity concentration that is higher than an impurity concentration of the first semiconductor region.

5. The method according to claim 3, wherein
    the nickel layer has a first surface and a second surface opposite to each other, the first surface being in contact with the semiconductor region, and
    the aluminum is so ion-implanted that a concentration of the aluminum has a peak thereof in the nickel layer, the peak being closer to the first surface than to the second surface of the nickel layer.

6. The method according to claim 3, further comprising:
    ion-implanting nickel in the nickel layer and the semiconductor region after forming the nickel layer but before ion-implanting the aluminum.

7. The method according to claim 6, wherein
    the nickel is so ion-implanted that a concentration of the ion-implanted nickel has a peak thereof in the semiconductor region, substantially at an interface between the nickel layer and the semiconductor region.

8. The method according to claim 3, wherein
    the nickel layer is formed on an entire surface of the semiconductor substrate, and the method further includes removing the nickel layer excluding a portion thereof on the semiconductor region, before performing the heat treatment.

9. The method according to claim 3, wherein
the heat treatment causes a portion of the nickel layer to react with the semiconductor region; and the method further includes:

forming an oxide film on the semiconductor region after selectively forming the semiconductor region, and subsequently forming the nickel layer on the oxide film; and removing another portion of the nickel layer that is unreacted, after performing the heat treatment.

10. The method according to claim 3, wherein
the aluminum is ion-implanted in the nickel layer above the semiconductor region and the semiconductor substrate.

11. The method according to claim 3, further comprising:
forming a resist on the nickel layer above the semiconductor substrate, after forming the nickel layer but before ion-implanting the aluminum, wherein the aluminum is ion-implanted in the nickel layer on the semiconductor substrate.

* * * * *